(12) United States Patent
Pittikoun

(10) Patent No.: US 7,071,061 B1
(45) Date of Patent: Jul. 4, 2006

(54) METHOD FOR FABRICATING NON-VOLATILE MEMORY

(75) Inventor: Saysamone Pittikoun, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 11/162,833

(22) Filed: Sep. 26, 2005

(30) Foreign Application Priority Data

Jan. 11, 2005 (TW) .............................. 94100698 A

(51) Int. Cl.
*H01L 21/336* (2006.01)
(52) U.S. Cl. ...................... 438/267; 438/157; 438/283; 438/287; 438/288; 438/304
(58) Field of Classification Search ................ 438/157, 438/283, 287, 288, 267, 304; 257/E29.309
See application file for complete search history.

(56) References Cited

U.S. PATENT DOCUMENTS

| 5,930,631 | A | 7/1999 | Wang et al. | ................. 438/286 |
|---|---|---|---|---|
| 6,524,915 | B1* | 2/2003 | Kim et al. | ................... 438/267 |
| 6,580,120 | B1* | 6/2003 | Haspeslagh | .................. 257/315 |
| 2005/0224858 | A1* | 10/2005 | Hung et al. | .................. 257/314 |

FOREIGN PATENT DOCUMENTS

TW 93125069 2/2006

* cited by examiner

*Primary Examiner*—George Fourson
*Assistant Examiner*—Julio Maldonado
(74) *Attorney, Agent, or Firm*—Jianq Chyun IP Office

(57) ABSTRACT

A method of fabricating a non-volatile memory is described. A substrate is provided and a first dielectric layer, an electron trapping layer and a second dielectric layer are sequentially formed thereon. Each of the stacked gate structures includes a first gate and a cap layer having a gap between every two stacked gate structures. An oxide layer is formed on the sidewalls of the first gate. A portion of the second dielectric layer not covered by the stacked gate structures is removed. A third dielectric layer is further formed on the substrate. A second conductive layer is formed over the substrate, and a portion thereof to form second gates. The second gates and the stacked gate structures form a column of memory cells. A source region and a drain region are formed in the substrate adjacent to two sides of the column of memory cells.

19 Claims, 5 Drawing Sheets

METHOD FOR FABRICATING NON-VOLATILE MEMORY

CROSS-REFERENCE TO RELATED APPLICATION

This application claims the priority benefit of Taiwan application serial no. 94100698, filed on Jan. 11, 2005. All disclosure of the Taiwan application is incorporated herein by reference.

BACKGROUND OF THE INVENTION

1. Field of the Invention

The present invention generally relates to a fabrication method for a semiconductor memory. More particularly, the present invention relates to a fabrication method for a non-volatile memory.

2. Description of Related Art

Upon various non-volatile memories, electronic erasing programming read only memory (EEPROM), which can provide the advantages of multiple data writing, reading, erasing and the data maintained even after the disconnection or the power supply, has been widely applied to the personal computers and electronic equipments.

The material for the floating gate and the control gate of the conventional erasable and programmable read only memory is normally doped polysilicon. In order to prevent an over erasing which may lead to misinterpretation of data, a select gate is set-up on the side walls of the control gate and the floating gate, and the substrate to form a split-gate structure.

Conventionally, a charge trapping layer is applied to replace the polysilicon floating gate, and the material for the charge trapping layer can be, for example, silicon nitride. Normally, there are two silicon oxide layers above and under the charge trapping layer to form the oxide-nitride-oxide (ONO) structure. This kind of device is normally known as a silicon/silicon oxide/silicon nitride/silicon oxide/silicon (SONOS) device. The split-gate SNONS device has already been disclosed, for example, in U.S. Pat. No. 5,930,631.

However, the above mentioned split-gate SONOS devices require a larger spilt-gate region and a bigger size of the memory cell in order to set up the spilt-gate structure; therefore, the size of the split-gate SONOS device is bigger than that of the electrical erasable and programmable read only memory with a stacked gate. Therefore, the level of integration can not be increased.

TA non-volatile memory has been disclosed in the Taiwan patent application no: 93125069. As shown in the FIG. 1, the non-volatile memory is comprised of a few memory cells 102 and 116 to form a memory cell array. The memory cell 102 and memory cell 116 are separated by the spacer 110. The memory cell 102 is formed with a bottom dielectric layer 104a, a charge trapping layer 104b, a top dielectric layer 104c (the composite dielectric layer 104 is comprised of a bottom dielectric 104a, a charge trapping layer 104b and a top dielectric layer 104c), a gate 106 and a mask 108, and the above mentioned components are stacked sequentially from the substrate 100. Memory cell 116 is located between two memory cells 102. In a similar manner, the memory cell 116 is stacked, in order form the substrate 100, a bottom dielectric layer 112a, a charge trapping layer 112b, a top dielectric layer 112c (the composite dielectric layer 112 is further comprised of a bottom dielectric layer 112a, a charge trapping layer 112b and a top dielectric layer 112c), and a gate 214. As there is no spacer between the memory cells, the level of integration for this non-volatile memory can be increased.

However, according to the fabrication method disclosed by the prior art, the composite dielectric layer 104 of the memory cell 102 and the composite dielectric layer 112 of the memory cell 116 are manufactured under different processes; therefore the fabrication is more complex. Besides, the memory cell is formed in between two memory cells. Therefore, the composite dielectric layer 112 of the memory cell 116 is formed on a non-planar surface. An inconsistency between the memory cell 102 and memory cell 116 may occur due to the non-uniform thickness of the composite dielectric layer 112 of the memory cell 116. The reliability of the memory cell 116 is compromised.

SUMMARY OF THE INVENTION

Accordingly, the present invention is directed to a fabrication method of a non-volatile memory to increase the level of integration and efficiency of the devices with simplified process and reduced cost.

According to an embodiment of the present invention, the fabrication method for a non-volatile memory is comprised of providing a substrate and forming a first dielectric layer, a charge trapping layer and the second dielectric layer sequentially. Then, a plurality of stacked gate structures is formed above the second dielectric layer, where each of the stacked gate structures is further comprised of a first gate. Further, the two adjacent stacked gate structures are separated by a spacer. Then, the second dielectric layer that is not covered by the stacked gate structures is removed to expose the charge trapping layer. Thereafter, a third dielectric layer is formed above the substrate to cover the surface of the stacked gate structure and expose the charge trapping layer. Furthermore, a second conducting layer is formed and a portion of the second conducting layer is removed to form a plurality of second gates which fills the gaps between the stacked gate structures. The second gates and the stacked gate structures constitute a column of memory cell.

In accordance with the fabrication method for the above mentioned non-volatile memory, each gate structure is further comprised of a cap layer, which is located above the first gate.

In accordance with the fabrication method for the above mentioned non-volatile memory, the method of forming a plurality of stacked gate structures above the second dielectric layer includes forming a first conducting layer. Then an insulating layer is formed above the first conducting layer. Both the insulating layer and the first conducting layer are further patterned.

The fabrication method of the above mentioned non-volatile memory is further comprised of forming a fourth dielectric layer on the side walls of the first gate.

In accordance with the fabrication method for the above mentioned non-volatile memory, the formation of the fourth dielectric layer includes, for example, performing a thermal oxidation.

In accordance with the fabrication method for the above mentioned non-volatile memory, the material for the fourth dielectric layer is, for example, silicon oxide.

In accordance with the fabrication method for the above mentioned non-volatile memory, the method for removing a portion of the second dielectric layer which is not covered by the stacked gate structure can be, for example, dry etching.

In accordance of the fabrication method for the above mentioned non-volatile memory, the method for forming the first dielectric layer includes but not limited to thermal oxidation.

In accordance to the fabrication method for the above mentioned non-volatile memory, the method for forming the charge trapping layer above the first dielectric layer is, for example, chemical vapor deposition.

In accordance to the fabrication method for the above mentioned non-volatile memory, the method for forming the second dielectric layer above the charge trapping layer is, for example, chemical vapor deposition.

In accordance to the fabrication method for the above mentioned non-volatile memory, the method for forming the second conducting layer above the substrate is, for example, chemical vapor deposition.

In accordance of the fabrication method for the above mentioned non-volatile memory, the method for removing a portion of the second conducting layer includes, for example, dry etching or chemical mechanical polishing.

In accordance to the fabrication method for the above mentioned non-volatile memory, the method for forming a source region and drain region is, for example, ion implantation.

In accordance to the fabrication method for the above mentioned non-volatile memory, the material for the first dielectric layer is, for example, silicon oxide.

In accordance to the fabrication method for the above mentioned non-volatile memory, the material for the charge trapping layer is, for example, silicon nitride.

In accordance of the fabrication method for the above mentioned non-volatile memory, the material for the second dielectric layer is, for example, silicon oxide.

In accordance to the fabrication method for the above mentioned non-volatile memory, the material for the third dielectric layer is, for example, silicon oxide.

In accordance of the fabrication method for the above mentioned non-volatile memory, the material for the first conducting layer is, for example, doped polysilicon.

In accordance to the fabrication method for the above mentioned non-volatile memory, the material for the second conducting layer is, for example, doped polysilicon.

In accordance to the fabrication method for the non-volatile memory of the present invention, there is no demand for the lithography and etching processes for forming the gate structures between the stacked gate structures. Therefore, the fabrication process is simplified and the cost is reduced. On the other hand, the first memory cell constituted by the first gate and the second memory cell constituted by the second gate share the first dielectric layer and the charge trapping layer. Not only the fabrication process is simplified, the quality of the bottom oxide layer for the second memory cell, which is always undesirable when formed with the conventional method, is also improved.

It is to be understood that the foregoing general description and the following detailed description are exemplary and explanatory only and are not restrictive of the invention, as claimed.

DESCRIPTION OF THE EMBODIMENTS

Figure 1:
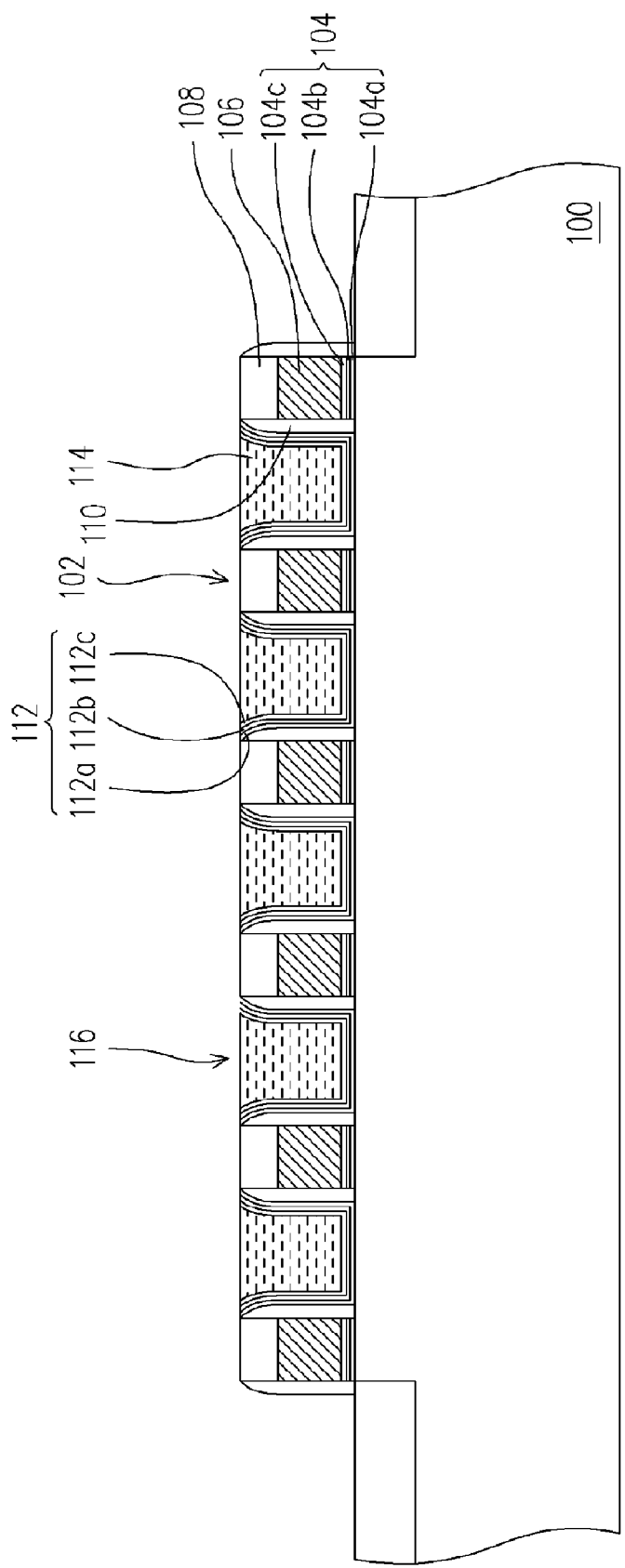
FIG. 1 illustrates a cross sectional view of a non-volatile memory according to the prior art.
Figure 2A:
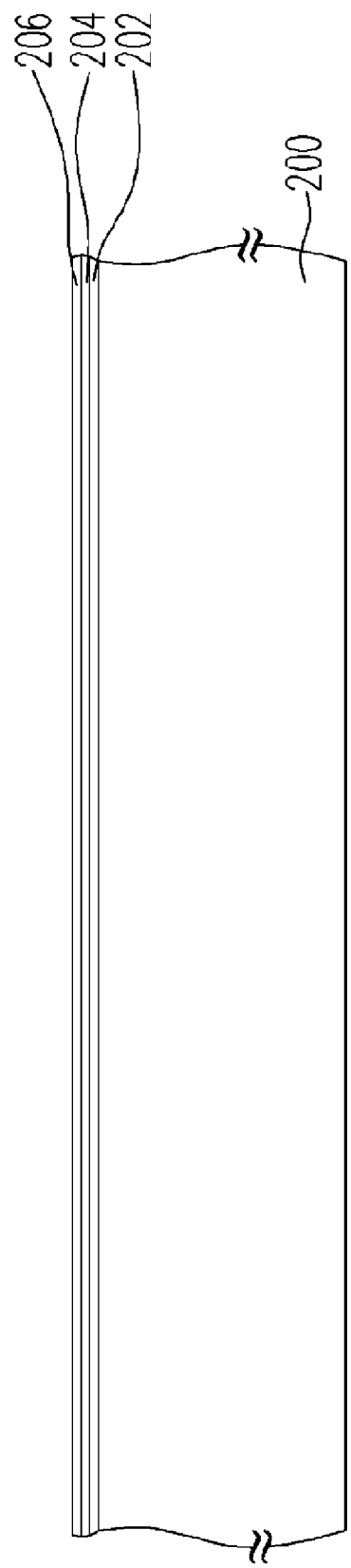
FIG. 2A to FIG. 2D are schematic cross-sectional views showing the steps for fabricating a non-volatile memory according to one embodiment of the present invention.

FIG. 2A to FIG. 2D are schematic cross-sectional views showing the steps for fabricating a non-volatile memory according to one embodiment of the present invention Referring to FIG. 2A, a substrate 200 is provided, and the material for the substrate can be, for example, silicon. Then, a bottom dielectric layer 202, a charge trapping layer 204 and a top dielectric layer 206 are subsequently formed on the substrate 200. The material for the bottom dielectric layer 202 is, for example, silicon oxide, and the fabrication method can be, for example, thermal oxidation. The material for the charge trapping layer 204 is, for example, silicon nitride, and the fabrication method is, for example, chemical vapor deposition. The material for the top dielectric layer 206 is, for example, silicon oxide, and the fabrication method is, for example, chemical vapor deposition. The material for the bottom dielectric layer 202 and the top dielectric layer 206 can be other similar materials. The material for the charge trapping layer 204 is not limited to the silicon nitride, and can be the other materials, for example, tantalum oxide layer, strontium titanate layer, hafnia oxide layer . . . etc., that can trap charges.

Figure 2B:
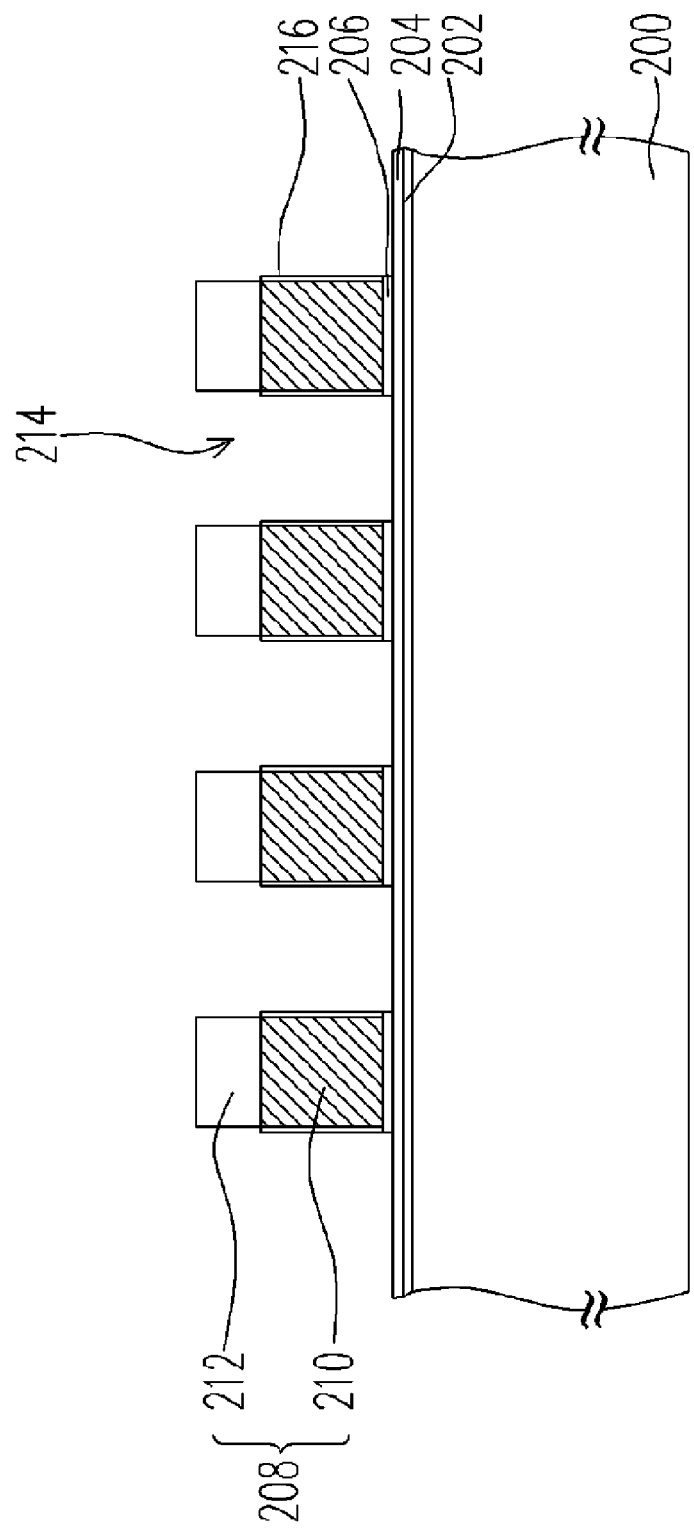

Thereafter, as shown in FIG. 2B, a plurality of stacked gate structures 208 is formed above the substrate 200, and a gap 214 is present between two adjacent stacked gate structures. Each of the stacked gate structures 208 is comprised of a conducting layer 210 (gate) and a cap layer 212. The fabricating method for the stacked gate structure 208 is, for example, by forming a conducting material layer (not shown in the figures) and an insulating material layer (not shown in the figures) accordingly. Then, using a top dielectric layer 206 as an etching stop layer to perform the lithography and etching process to pattern the conducting material layer and the insulating material layer. The material for the conducting layer is, for example, doped polysilicon, and the formation method is, for example, by forming a non-doped polysilicon first, followed by performing an ion implantation process. The material for the cap layer is, for example, silicon nitride; and the formation method is, for example, chemical vapor deposition.

Thereafter, an oxide layer 216 is formed aside the conducting layer 210. The material for the oxide layer 216 is, for example, silicon oxide, and the fabrication method is, for example, thermal oxidation.

Afterwards, the portion of top dielectric layer 206 which is not covered by stacked gate structures 208 is removed, for example, by using the charge trapping layer 204 as etch stop layer to perform a dry etching.

Figure 2C:
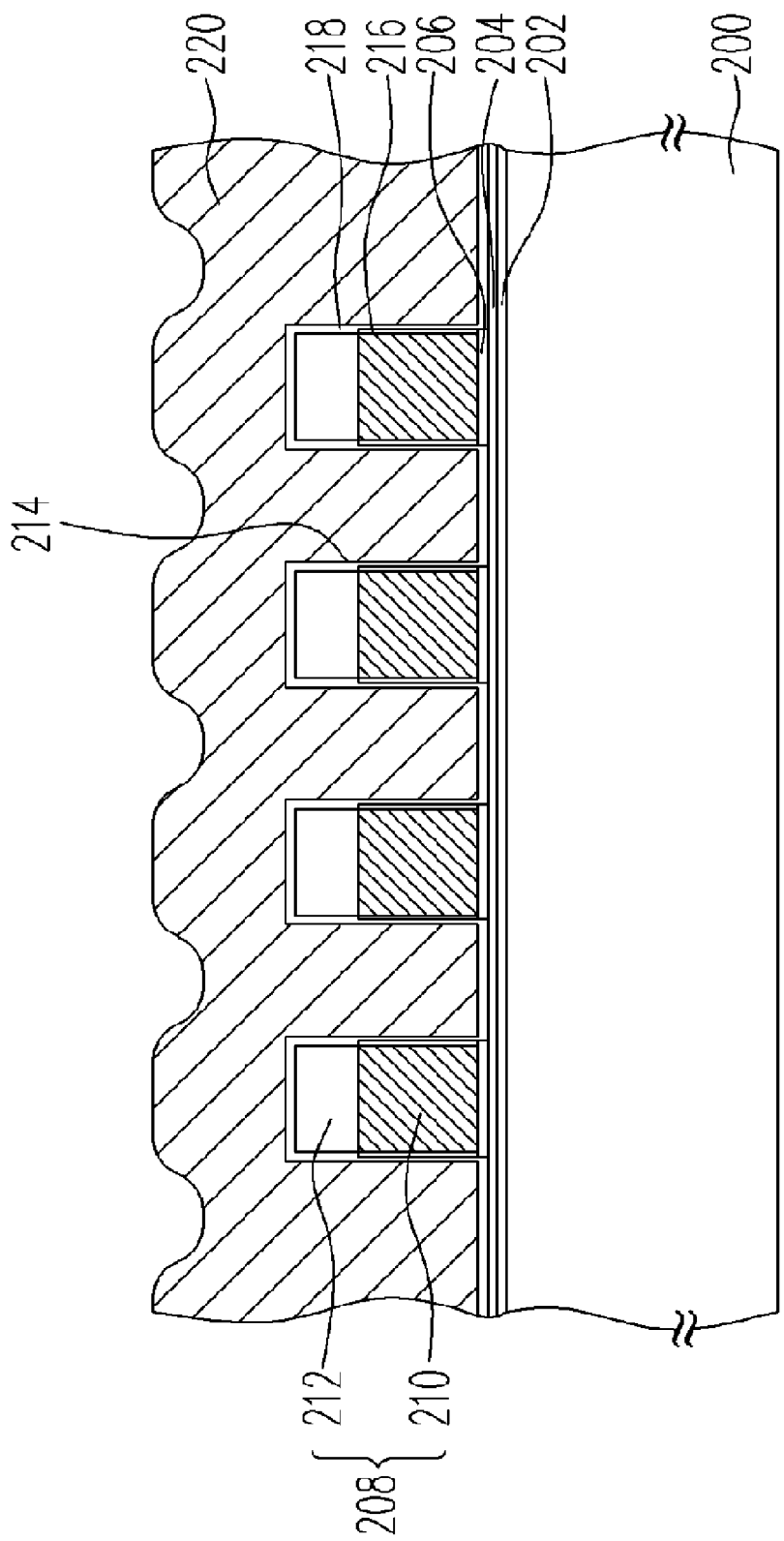

Turning to FIG. 2C, a dielectric layer 218 is formed over the entire surface to cover the stacked gate structures 208, the oxide layer 216 and the exposed charge trapping layer 204. The material for the dielectric layer 218 is, for example, silicon oxide, and the fabrication method is, for example, chemical vapor deposition. Noteworthy to be mentioned is that these two conducting layers, the dielectric layer 218 and the oxide layer 216 can be electrically isolated.

Afterwards, a conducting material layer 220 is formed above the substrate 200 and filled into the gaps 214 between the stacked gate structures 208. The conducting material layer 220 is formed by, for example, a non-doped polysilicon through chemical vapor deposition and then followed by performing an ion implantation process.

Figure 2D:
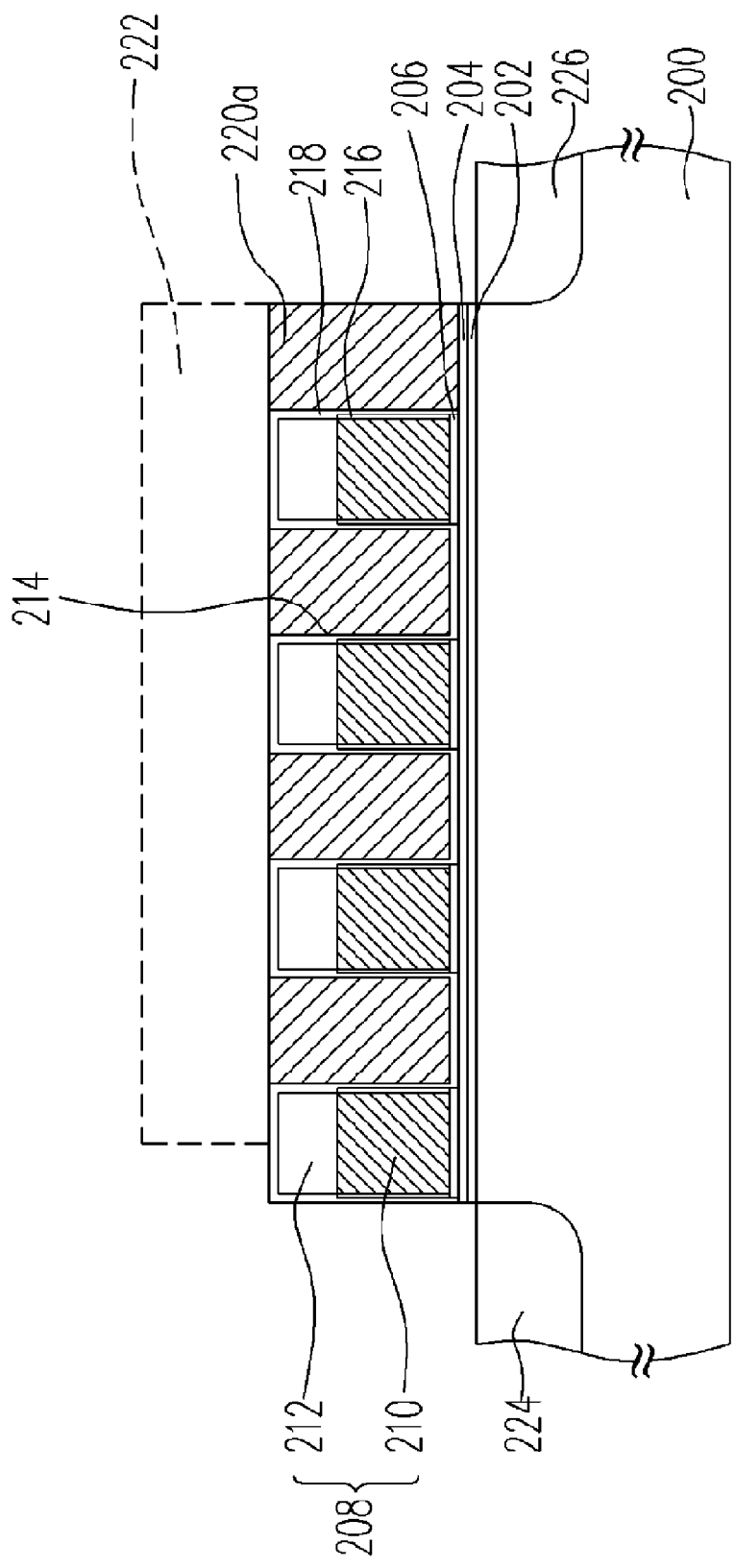

Referring next to FIG. 2D, a portion of the conducting material layer 220 is removed to form conducting layer (gate) 220a that fills the gaps 214 between the stacked gate structures 208. The memory array is formed with the conducting layer 220a and the stacked gate structures 208, wherein the stacked gate structures 208 are connected together. The method for removing a portion of the conducting layer 220 is, for example, by using the dielectric layer 218 which covers the stacked gate structure 208 as an etching stop layer or a polishing stop layer to conduct a dry etching process or a chemical mechanical polishing process. In the other embodiment, in order to reduce the resistance of the conducting layer 220a, a silicide layer can be formed above the conducting layer 220a.

The manufacturing process is continued by forming a patterned mask layer 222 on the substrate, wherein the regions predetermined for the source region and the drain region are exposed. Then, an etching process is performed to remove a residual of the conducting layer 220a on the regions predetermined for the source region and the drain region, the top dielectric layer 206, the charge trapping layer 204, and the bottom dielectric layer 202.

Afterwards, an ion implantation process is performed using the mask layer 222 as a mask to form a source region 224 and the drain region 226 in the substrate 200. The source region 224 and the drain region are located beside the two sides of the connecting stacked gate structures 208 and conducting layer 220a in the substrate 200. Then, the mask layer 222 is removed. The remaining process of the fabrication of the non-volatile memory is well known in the art a detailed description thereof will be omitted.

In above mentioned embodiments, another type of the gate structure can be formed inside the stacked gate structure 208 to improve the level of integration for the memory device. In addition, the memory cell constituted with the stacked gate structure 208, the conducting layer 220a, and the stacked gate structure 208 share the same bottom dielectric layer 202 and the charge trapping layer 204 on a planar substrate 200. A better quality of the films and improved reliability for the memory cell can be obtained.

The above mentioned embodiment applies 8 memory cells structure as the example. However, the fabrication for the memory cell array of the present invention can be adjusted according to the appropriate number of the memory cell, for example, the same bit line is allowed to connect 32 to 64 memory cell structures. And the fabrication of the non-volatile memory can be, in fact, applied to the fabrication of the whole memory cell array.

In conclusion of the above description, the present invention provides at least the following advantages.

1. In accordance to the fabrication method for the present invention, additional type of the gate structure can be formed inside the stacked gate structure. Not only the fabrication process is simplified, but the level of integration of the memory devices is also improved.

2. In accordance to the fabrication method for the non-volatile memory of the present invention, the memory cells formed with different types of gate structures share the bottom oxide layer and the charge trapping layer. Therefore the fabrication processes are shortened and the cost is reduced.

3. In accordance to the fabrication method for the non-volatile memory of the present invention, the memory cells formed with different types of gate structures share the bottom oxide layer and the charge trapping layer on the planar surface of the substrate Therefore, the quality is consistent and the reliability of the memory devices can be improved.

4. In accordance to the fabrication method for the non-volatile memory of the present invention, the memory cells formed with different types of gate structures share the bottom oxide layer and the charge trapping layer to save the thermal budget effectively.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method of a non-volatile memory, the fabrication method of a non-volatile memory comprising:
   forming a first dielectric layer over a substrate;
   forming a charge trapping layer;
   forming a second dielectric layer;
   forming a plurality of stacked gate structures above the second dielectric layer, wherein each stacked gate structures further comprises a first gate and every two of the adjacent stacked gate structures comprises a gap there between;
   removing the second dielectric layer not covered by the stacked gate structures to expose the charge trapping layer;
   forming a third dielectric layer to cover a surface of the stacked gate structures and the exposed surface of the charge trapping layer;
   forming a second conducting layer above the substrate;
   removing a portion of the second conducting layer to form a plurality of second gates which each fills the gap between the stacked gate structures, and the second gates and the stacked gate structures form a column of memory cells; and
   forming a source region and a drain region beside two sides of the column of memory cells in the substrate.

2. The fabrication method for the non-volatile memory as recited in claim 1, wherein each stacked gate structure further comprises a cap layer disposed above the first gate.

3. The fabrication method for the non-volatile memory as recited in claim 1, wherein the step of forming the plurality of the stacked gate structures above the second dielectric layer comprises: forming a first conducting layer over the second dielectric layer;
   forming an insulating layer above the first conducting layer; and
   patterning both the insulating layer and the first conducting layer to form the cap layers and the first gates.

4. The fabrication method for the non-volatile memory as recited in claim 1 further comprises a step of forming a fourth dielectric layer on side walls of the first gate.

5. The fabrication method for the non-volatile memory as recited in claim 4, wherein the formation of the fourth dielectric layer comprises a thermal oxidation process.

6. The fabrication method for the non-volatile memory as recited in claim 4, wherein a material constituting the fourth dielectric layer comprises silicon oxide.

7. The fabrication method for the non-volatile memory as recited in claim 1, where the step for removing the portion of the second dielectric layer not covered by the stacked gate structures comprises a dry etching process.

8. The fabrication method for the non-volatile memory as recited in claim 1, wherein the step for forming the first dielectric layer comprises of a thermal oxidation process.

9. The fabrication method for the non-volatile memory as recited in claim 1, wherein the step for forming the charge trapping layer above the first dielectric layer comprises a chemical vapor deposition process.

10. The fabrication method for the non-volatile memory as recited in claim 1, wherein the step for forming the second dielectric layer above the charge trapping layer comprises a chemical vapor deposition process.

11. The fabrication method for the non-volatile memory as recited in claim 1, wherein the step for forming the second conducting layer above the substrate comprises performing a chemical vapor deposition process.

12. The fabrication method for the non-volatile memory as recited in claim 1, wherein the step for removing the portion of the second conducting layer comprises performing a dry etching process or a chemical mechanical polishing process.

13. The fabrication method for the non-volatile memory as recited in claim 1, wherein the step for forming a source region and drain region comprises an ion implantation process.

14. The fabrication method for the non-volatile memory as recited in claim 1, wherein a material constituting the first dielectric layer comprises silicon oxide.

15. The fabrication method for the non-volatile memory as recited in claim 1, wherein a material constituting the charge trapping layer comprises silicon nitride.

16. The fabrication method for the non-volatile memory as recited in claim 1, wherein a material constituting the second dielectric layer comprises silicon oxide.

17. The fabrication method for the non-volatile memory as recited in claim 1, wherein a material constituting the third dielectric layer comprises silicon oxide.

18. The fabrication method for the non-volatile memory as recited in claim 1, where a material constituting the first conducting layer comprises doped polysilicon.

19. The fabrication method for the non-volatile memory as recited in claim 1, wherein a material constituting the second conducting layer comprises doped polysilicon.

* * * * *